United States Patent
Lee

(10) Patent No.: US 8,436,478 B2
(45) Date of Patent: May 7, 2013

(54) METHODS OF FLUXLESS MICRO-PIERCING OF SOLDER BALLS, AND RESULTING DEVICES

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 12/827,476

(22) Filed: Jun. 30, 2010

(65) Prior Publication Data

US 2010/0264541 A1  Oct. 21, 2010

Related U.S. Application Data

(62) Division of application No. 11/958,842, filed on Dec. 18, 2007, now Pat. No. 7,749,887.

(51) Int. Cl.
| H01L 23/52 | (2006.01) |
| H01L 23/48 | (2006.01) |
| H01L 29/40 | (2006.01) |

(52) U.S. Cl.
USPC .......... 257/780; 257/E21.511; 257/738; 257/786; 438/612; 438/613

(58) Field of Classification Search .......... 257/E23.023, 257/E21.506, E21.508, E21.511, 734, 738, 257/778–781, 786; 438/113, 119, 455, 612–614; 228/180.1

See application file for complete search history.

(56) References Cited

U.S. PATENT DOCUMENTS

| 5,952,840 | A | 9/1999 | Farnworth et al. |
| 6,077,723 | A | 6/2000 | Farnworth et al. |
| 6,083,773 | A | 7/2000 | Lake |
| 6,335,571 | B1 * | 1/2002 | Capote et al. ................. 257/787 |
| 6,537,482 | B1 | 3/2003 | Farnworth |
| 6,634,100 | B2 | 10/2003 | Akram et al. |
| 6,667,556 | B2 | 12/2003 | Moden |
| 7,015,132 | B2 * | 3/2006 | Lahiri et al. ................... 438/614 |
| 7,122,907 | B2 | 10/2006 | Lee |
| 7,129,584 | B2 | 10/2006 | Lee et al. |
| 7,161,237 | B2 | 1/2007 | Lee |
| 7,205,661 | B2 | 4/2007 | Wark et al. |
| 7,838,954 | B2 * | 11/2010 | Buchwalter et al. .......... 257/437 |
| 7,969,004 | B2 * | 6/2011 | Ohnishi ......................... 257/737 |
| 8,294,279 | B2 * | 10/2012 | Chen et al. ..................... 257/777 |
| 8,299,368 | B2 * | 10/2012 | Endo .............................. 174/261 |
| 2001/0003296 | A1 * | 6/2001 | Morimoto et al. ............ 156/277 |
| 2001/0048153 | A1 | 12/2001 | Wark |
| 2001/0054771 | A1 * | 12/2001 | Wark et al. .................... 257/786 |
| 2002/0158655 | A1 | 10/2002 | Wark |

(Continued)

OTHER PUBLICATIONS

Office Action issued Nov. 24, 2011 in P.R.C. Application No. 200880121032.X, 11 pages.
Office Action issued May 7, 2012 in Taiwan Application No. 097148258, 7 pages.
Office Action issued Jun. 25, 2011 in Republic of Korea Application No. 10-2010-7012500, 6 pages.

(Continued)

*Primary Examiner* — Chris Chu
(74) *Attorney, Agent, or Firm* — Perkins Coie LLP

(57) ABSTRACT

A method is disclosed which includes forming a layer of conductive material above a substrate, forming a masking layer above the layer of conductive material, performing a first etching process on the layer of conductive material with the masking layer in place, removing the masking layer and, after removing the masking layer, performing an isotropic etching process on the layer of conductive material to thereby define a plurality of piercing bond structures positioned on the substrate.

20 Claims, 8 Drawing Sheets

U.S. PATENT DOCUMENTS

| | | |
|---|---|---|
| 2002/0185301 A1 | 12/2002 | Wark |
| 2002/0196041 A1 | 12/2002 | Wark |
| 2003/0168739 A1* | 9/2003 | Huang .................. 257/738 |
| 2003/0216023 A1 | 11/2003 | Wark et al. |
| 2004/0155357 A1 | 8/2004 | Ho et al. |
| 2004/0164389 A1 | 8/2004 | Lee |
| 2005/0174134 A1 | 8/2005 | Wark |
| 2006/0055034 A1 | 3/2006 | Wark et al. |
| 2006/0060968 A1 | 3/2006 | Wark et al. |
| 2007/0063722 A1 | 3/2007 | Wark |
| 2007/0090855 A1 | 4/2007 | Wark |
| 2007/0132097 A1 | 6/2007 | Wark et al. |
| 2009/0152719 A1 | 6/2009 | Lee |

OTHER PUBLICATIONS

Office Action issued Dec. 12, 2012 in Taiwan Application No. 097148258, 5 pages.

Lee, T.K. et al., "Instantaneous fluxless bonding of Au with Pb-Sn solder in ambient atmosphere," Journal of Applied Physics, 98, 034904, 2005.

International Search Report and Written Opinion of the International Search Authority issued Mar. 13, 2009 in International Application No. PCT/US2008/085433.

* cited by examiner

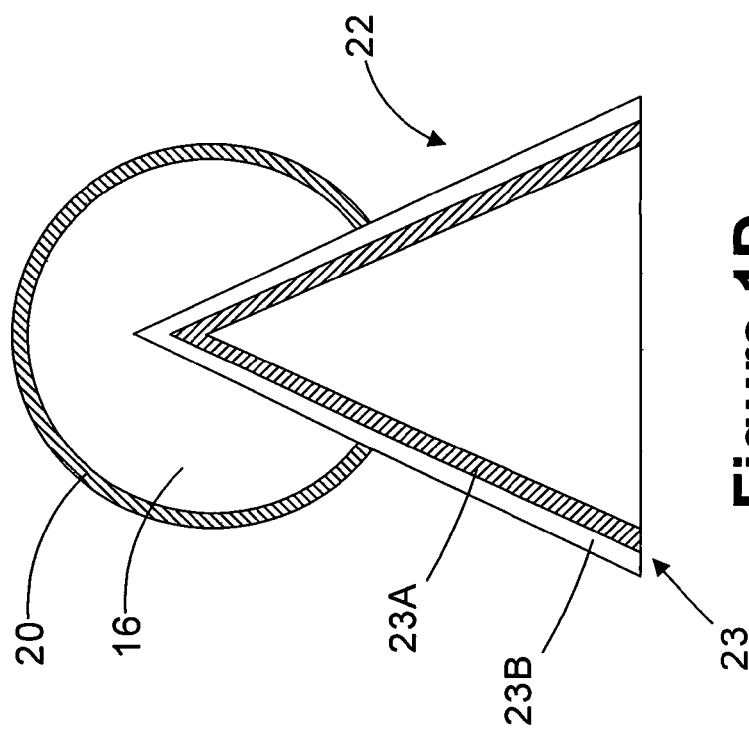
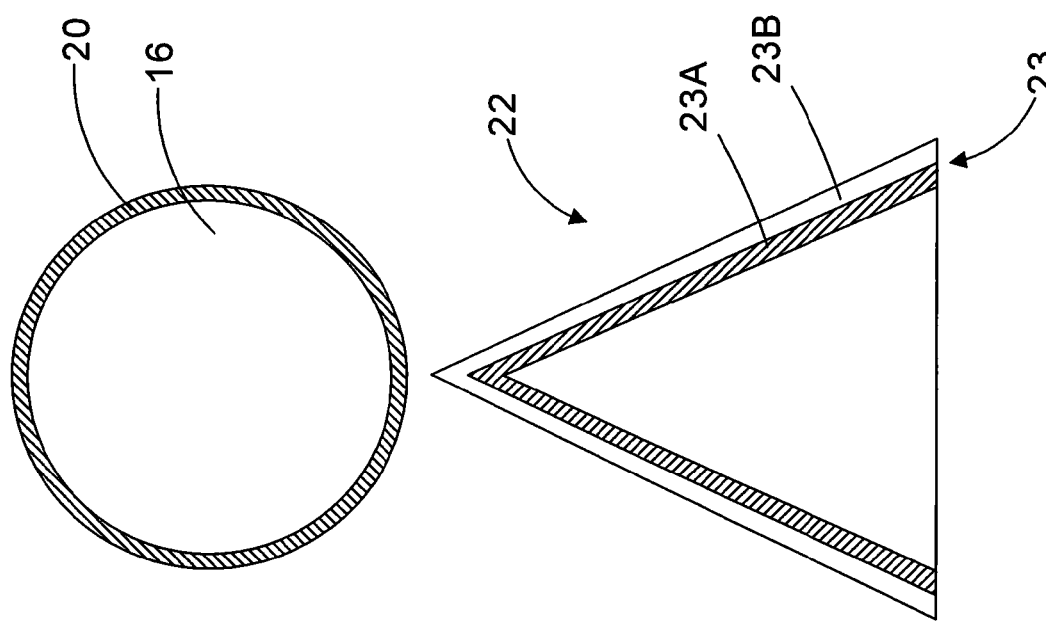

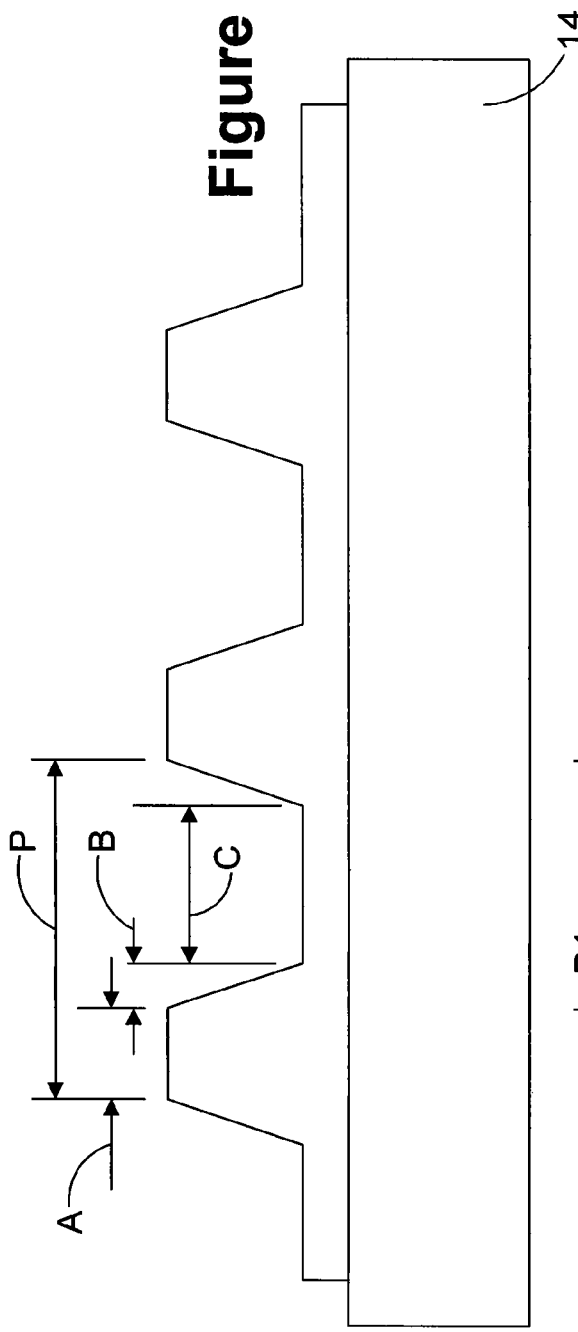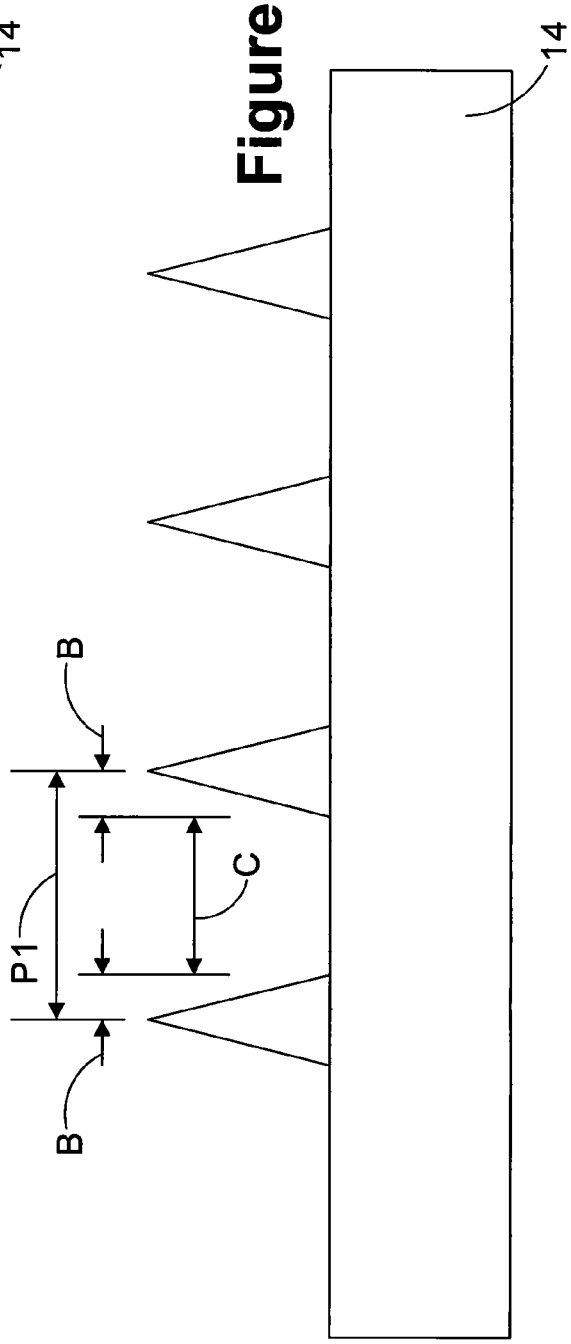

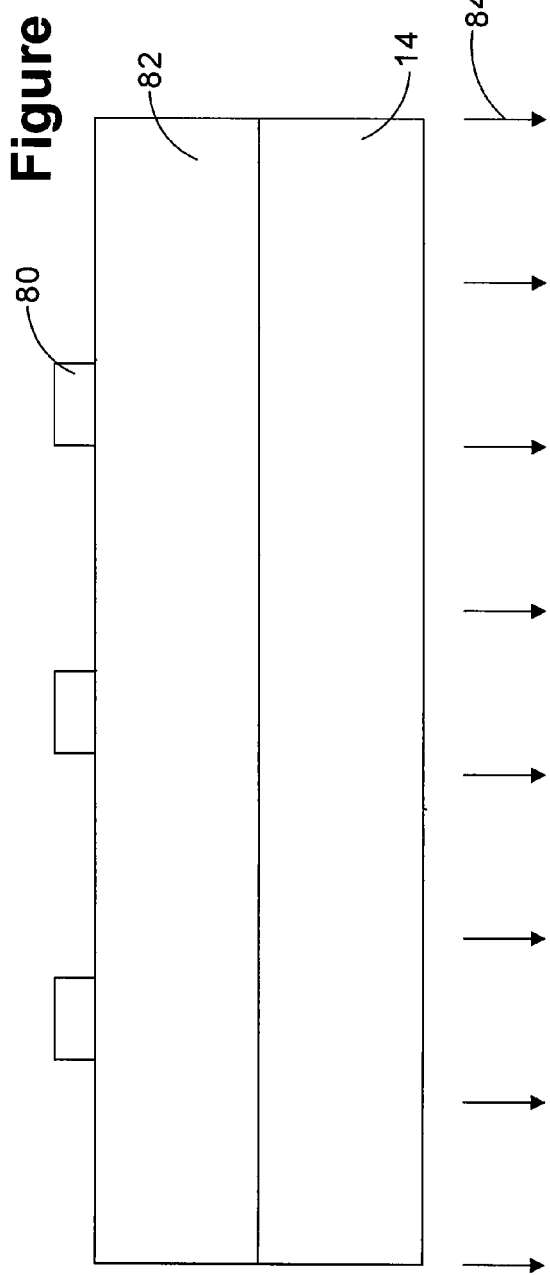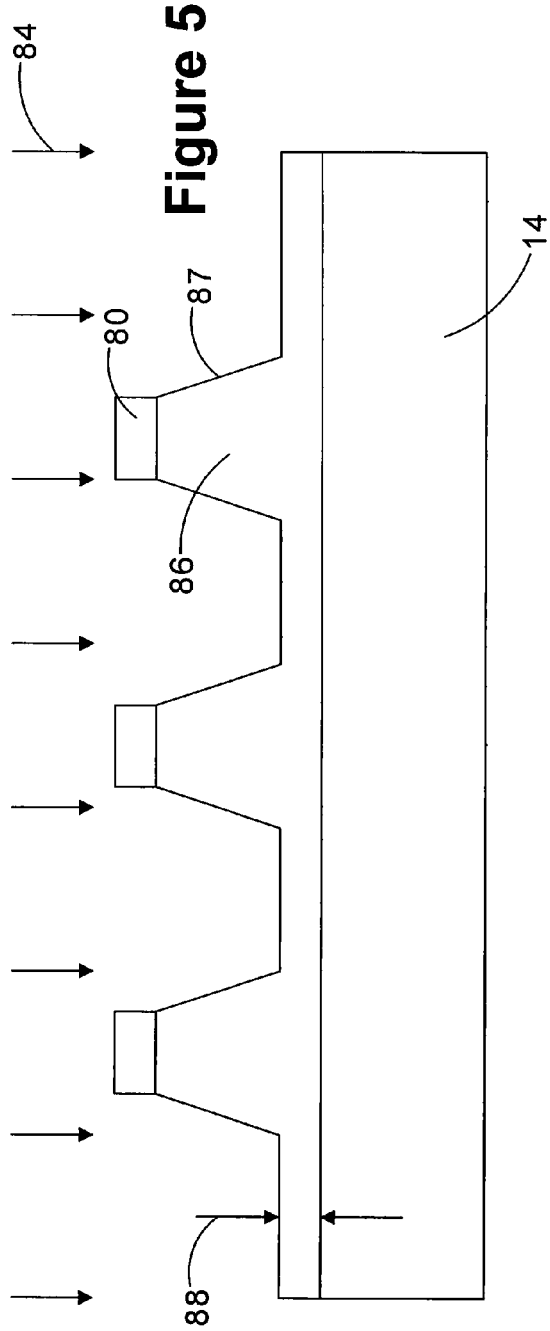

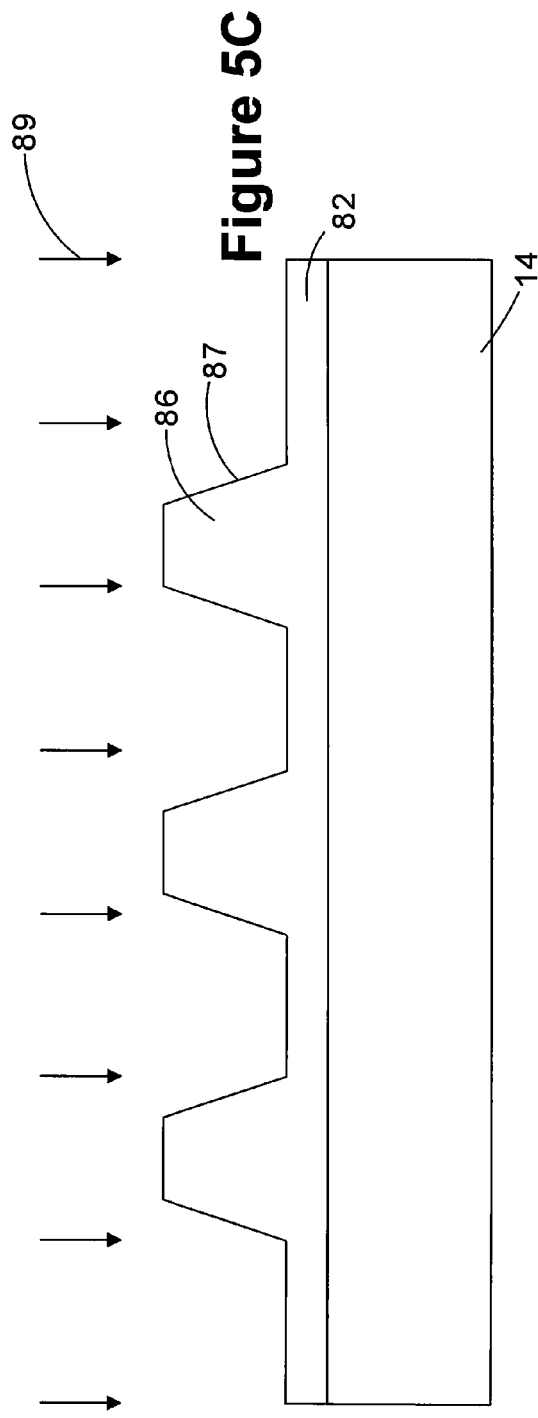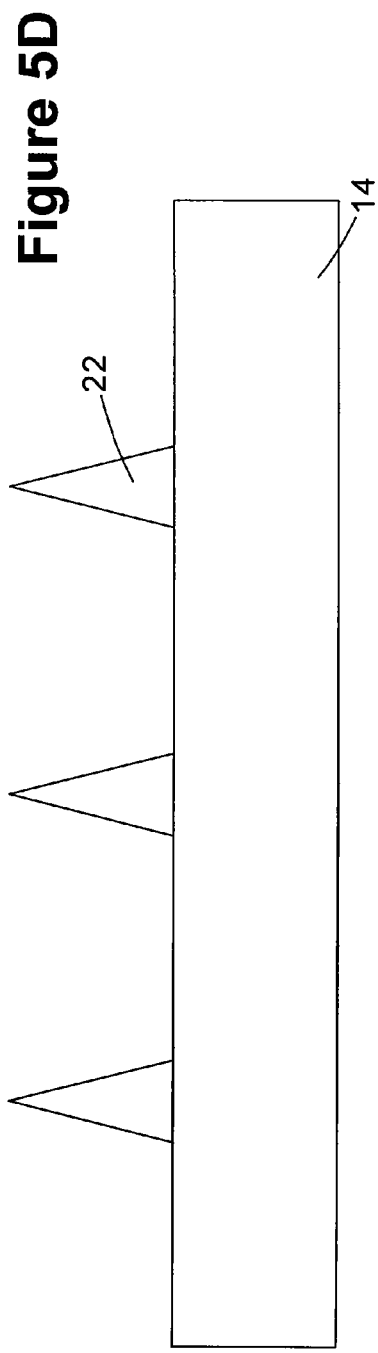

METHODS OF FLUXLESS MICRO-PIERCING OF SOLDER BALLS, AND RESULTING DEVICES

CROSS-REFERENCE TO RELATED APPLICATION

This application is a divisional of U.S. application Ser. No. 11/958,842 filed Dec. 18, 2007, now U.S. Pat. No. 7,749,887, which is incorporated herein by reference in its entirety.

TECHNICAL FIELD

The present subject matter is generally directed to the field of microelectronic devices and, more particularly, to methods of fluxless micro-piercing of solder balls, and the resulting devices.

DESCRIPTION OF THE RELATED ART

Chip-on-board and board-on-chip (BOC) techniques are used to attach semiconductor dies to an interposer or other carrier substrate such as a printed circuit board (PCB). Attachment can be achieved through flip chip attachment, wirebonding, or tape automated bonding ("TAB"). Flip chip attachment typically utilizes ball grid array (BGA) technology. The BGA component (die) includes conductive external contacts, typically in the form of solder balls or bumps, arranged in a grid pattern on the active surface of the die, which permit the die to be flip chip mounted to an interposer or other carrier substrate (e.g., PCB).

In a flip chip attachment, the balls of the BGA component are aligned with terminals on the carrier substrate, and connected by reflowing the solder balls. The solder balls can be replaced with a conductive polymer that is cured. A dielectric underfill is then interjected between the flip chip die and the surface of the carrier substance to embed the solder balls and mechanically couple the BGA component to the carrier substrate.

Wirebonding and TAB attachment generally involve attaching a die by its backside to the surface of a carrier substrate with an appropriate adhesive (e.g., epoxy) or tape. With wirebonding, bond wires are attached to each bond pad on the die and bonded to a corresponding terminal pad on the carrier substrate (e.g., interposer). With TAB, ends of metal leads carried on a flexible insulating tape, such as a polyimide, are attached to the bond pads on the die and to the terminal pads on the carrier substrate. A dielectric (e.g., silicon or epoxy) is generally used to cover the bond wires or metal tape leads to prevent damage.

Flip chip attachment has provided improved electrical performance and allowed greater packaging density. However, developments in ball grid array technology have produced arrays in which the balls are made smaller and with tighter pitches. As the balls become smaller and are set closer together, it poses problems for the mutual alignment of the conductive bumps on the flip chip die with the bond pads on the substrate or interposer. Flip chip attachment can also lead to high costs and process difficulties. For example, a flip chip mounter is required to accurately align the die to the interposer or substrate.

In flip chip packaging, solid-state welding, adhesive bonding and soldering are often used for joining the interconnect system. These bonding techniques face numerous assembly challenges. Soldering is the preferred bonding technique, thanks to its high assembly yield, ability to eliminate the probe mark through reflow, allowance for rework after assembly, electrical stability and high tolerance in placement accuracy because of self-alignment effects. However, some challenges still remain for soldering assembly, such as a long processing time and the need for a flux-based removal of oxides and hydrocarbons for solderability. For example, solder balls typically have an oxide layer formed on the outer surface of the ball due to the manufacturing processes employed to manufacture the solder balls in an ambient environment.

In making conductive connections to such solder balls, a flux is employed due to the presence of the oxide layer, i.e., flux is employed to remove such oxides. Processing time is lengthened by flux application, the vision time required for precise alignment and the need for a reflow process to provide sufficient wetting time for soldering. Flux removal of oxides leaves behind undesirable residues that are deleterious to package reliability. Entrapped residues also cause gross solder voids that can result in premature joint failure. Although chlorofluorocarbons (CFCs) are effective in removing flux residues, they are environmentally hazardous and do not present a long-term solution. Thus, the use of flux and its cleaning processes erects a barrier to flip chip deployment in the packaging and integration of microelectronic, optoelectronic and microelectromechanical systems. Fluxless soldering processes, on the other hand, rely on a controlled atmosphere for the reduction of oxides for soldering, but this is cumbersome in high-volume implementation. Obviously, a method of instantaneous fluxless soldering in ambient atmosphere for flip chip assembly is highly desirable.

The present subject matter is directed to various methods and devices that may solve, or at least reduce, some or all of the aforementioned problems.

BRIEF DESCRIPTION OF THE DRAWINGS

The subject matter disclosed herein may be understood by reference to the following description taken in conjunction with the accompanying drawings, in which like reference numerals identify like elements, and in which:

FIGS. 1A-1D are various views of an illustrative device described herein;

FIGS. 2A-2B depict a reduced pitch that may be achieved using the piercing bond structures disclosed herein;

FIGS. 5A-5D depict one illustrative process flow for forming the piercing bond structures disclosed herein.

Figure 1A:
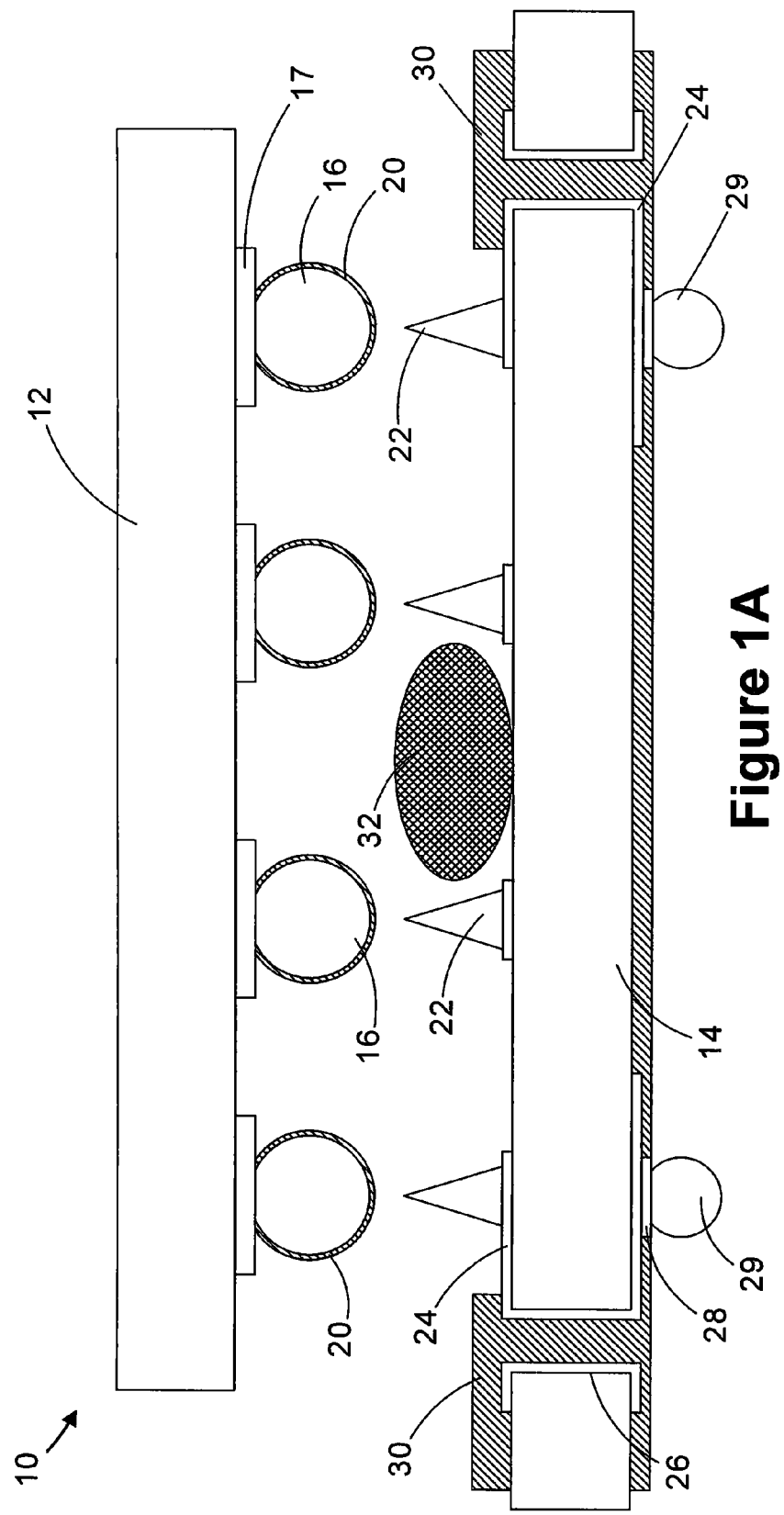

While the subject matter described herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 1B:
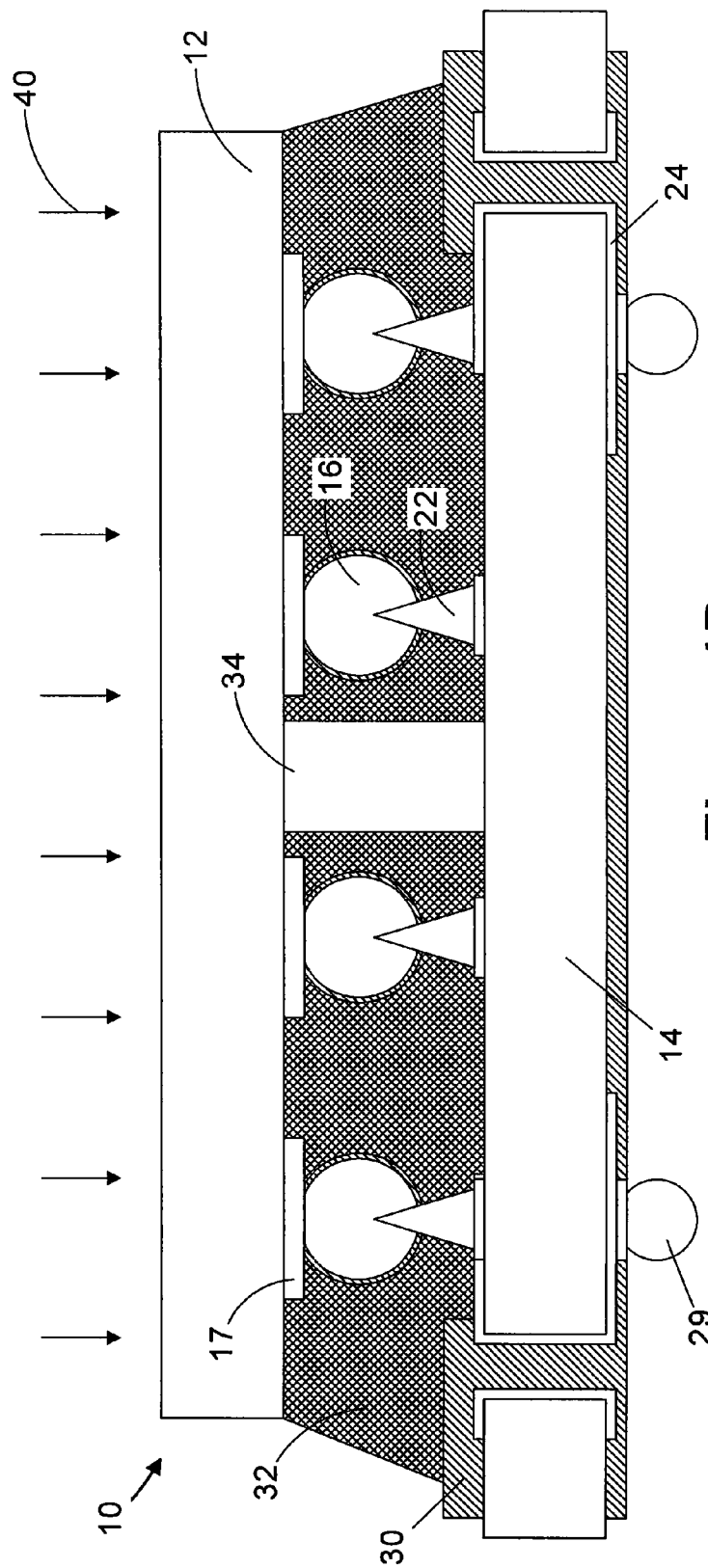

FIGS. 1A-1B depict an illustrative embodiment of a device 10 in accordance with one aspect of the present subject matter. The device 10 comprises a die 12 that is attached to an interposer or substrate 14, e.g., a printed circuit board. The terms "substrate" and "interposer" will be used interchangeably herein and they shall be understood to refer to any type of structure to which an integrated circuit die may be mounted. The die 12 comprises a plurality of schematically depicted solder balls 16 that are conductively coupled to conductive pads 17. The solder balls 16 have an illustrative oxide layer 20, e.g., tin oxide, formed on the outer surface thereof due to the manufacturing processes performed to form the solder balls 16. A plurality of piercing bond structures 22 are formed on the substrate 14. The piercing bond structures 22 are conductively coupled to illustrative wire traces or lines 24 that extend through vias 26 formed in the substrate 14. The wiring races 24 are conductively coupled to illustrative contact pads 28 formed on the substrate 14. A layer of dielectric material 30 is also provided to electrically isolate various electrical components on the substrate 14. At least one anti-oxidation film 23 (see FIG. 1C) is provided on the piercing bond structures 22.

FIG. 1A depicts the situation wherein the die 12 is positioned proximate the substrate 14 prior to attachment. The die 12 may be coupled to the substrate 14 using a variety of known techniques, e.g., adhesives, epoxies, etc. In the depicted example, an amount of non-conductive paste 32 is positioned on the substrate 14. A non-conductive film may, in some applications, be applied in lieu of the non-conductive paste 32.

FIG. 1B depicts the device 10 at the point of fabrication wherein the die 12 has been conductively coupled to the substrate 14 by virtue of the conductive engagement between the piercing bond structures 22 and the solder balls 16. The piercing bond structures 22 pierce the oxide layer 20 and the solder ball 16 to thereby establish this conductive connection. Also note that FIG. 1B depicts an illustrative standoff structure 34 that may be employed if desired or needed to ensure that the die 12 is positioned a fixed distance from the substrate 14.

In attaching the die 12 to the substrate 14, the device 10 is heated and an illustrative downforce 40 is applied. The magnitude of the downforce 40 may vary depending upon the particular application. In one illustrative embodiment, the downforce 40 may range from approximately 2-12 kg. In some specific applications, a downforce 40 of approximately 8 kg may be employed. The device 10 is heated to a temperature above the melting point of the material of the solder ball 16, e.g., to a temperature ranging from approximately 190-210° C. The downforce 40 may be applied for a duration of 0.5-2 seconds, depending on the particular application. The article entitled "Instantaneous Fluxless Bonding of Au with Pb—Sn Solder in Ambient Atmosphere," *Journal of Applied Physics*, Vol. 98, 034904 (2005) is hereby incorporated by reference in its entirety.

FIGS. 1C-1D are enlarged views of an illustrative solder ball 16 and piercing bond structure 22 prior to engagement (FIG. 1C) and after engagement (FIG. 1D). As mentioned previously, the piercing bond structure 22 has one or more anti-oxidation layers 23 formed on the structure 22 to prevent an oxide film from forming on the piercing bond structure 22. In the illustrative example depicted in FIGS. 1C-1D, the anti-oxidation layer 23 comprises a layer of gold 23A and a layer of nickel 23B. Of course, other materials may be employed. The layer of gold 23A may have a thickness of approximately 2.5 µm, while the layer of nickel 23B may have a thickness of approximately 0.3 µm.

FIGS. 2A-2B schematically depict the reduced pitch between adjacent conductive structures that may result by use of the piercing bond structures 22 disclosed herein. FIG. 2A schematically depicts an illustrative conductive bond structures 90 that are commonly formed using known techniques. The conventional bond structures 90 have a substantially planar upper or contact surface 92. In FIG. 2A, the width of the contact surface 92 is designated "A," the width of the sloped sidewalls 94, due to the isotropic nature of the etching process used to form the structures 90, is designated as "B" and the spacing between the structures 90 is designated as "C." Thus, the pitch "P" for the conductive structure 90 would be A+2B+C. In contrast, the pitch ("P1") between the piercing bond structures 22 shown in FIG. 2B would be equal to 2B+C. In short, using the techniques and piercing bond structures 22 disclosed herein, the pitch between conductive bonding structures (like the piercing bond structures 22 disclosed herein) may be substantially less as compared to prior art devices that employ bonding structures having a substantially planar or non-piercing upper surface 92, as shown in FIG. 2A. For example, using the piercing bond structures 22 described herein, the pitch "P1" may be approximately 60 µm minimum.

Figure 3:
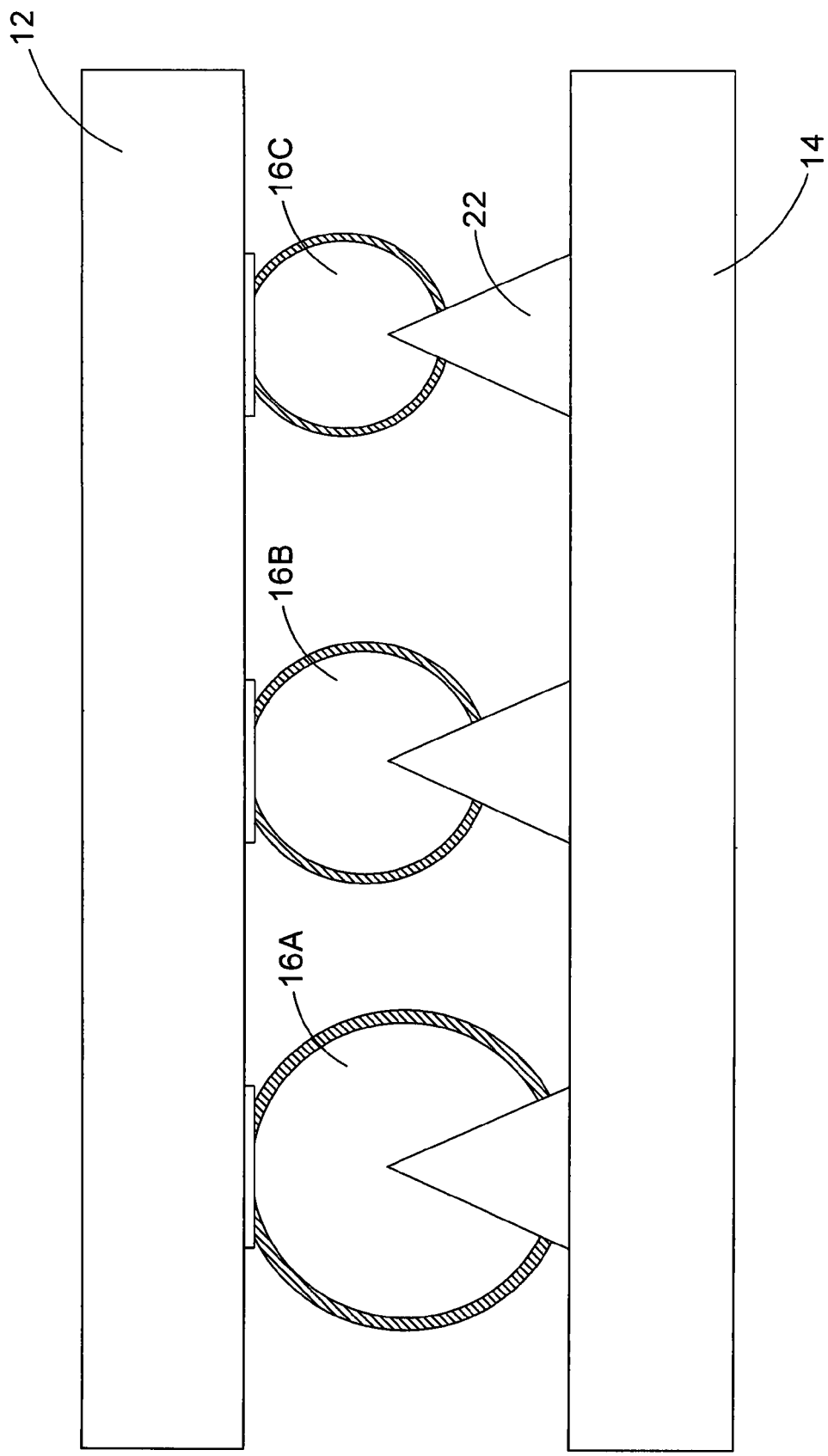
FIG. 3 depicts the piercing bond structures disclosed herein as engaged with different size solder balls.

As shown in FIG. 3, the methodologies and piercing bond structures 22 disclosed herein may be employed with solder balls 16A, 16B, 16C of differing sizes. Thus, the piercing bond structures 22 described herein may be employed with a vast variety of different connection technologies and techniques.

The present subject matter may also be employed to control the offset between the die 12 and the printed circuit board 14. In general, all other things being equal, the greater the downforce 40, the less the distance between the die 12 and the printed circuit board 14. The temperature during the engagement process can also be employed to control the spacing between the die 12 and the printed circuit board 14. In general, the greater the temperature, the less the spacing between the die 12 and the printed circuit board 14.

Figure 4:
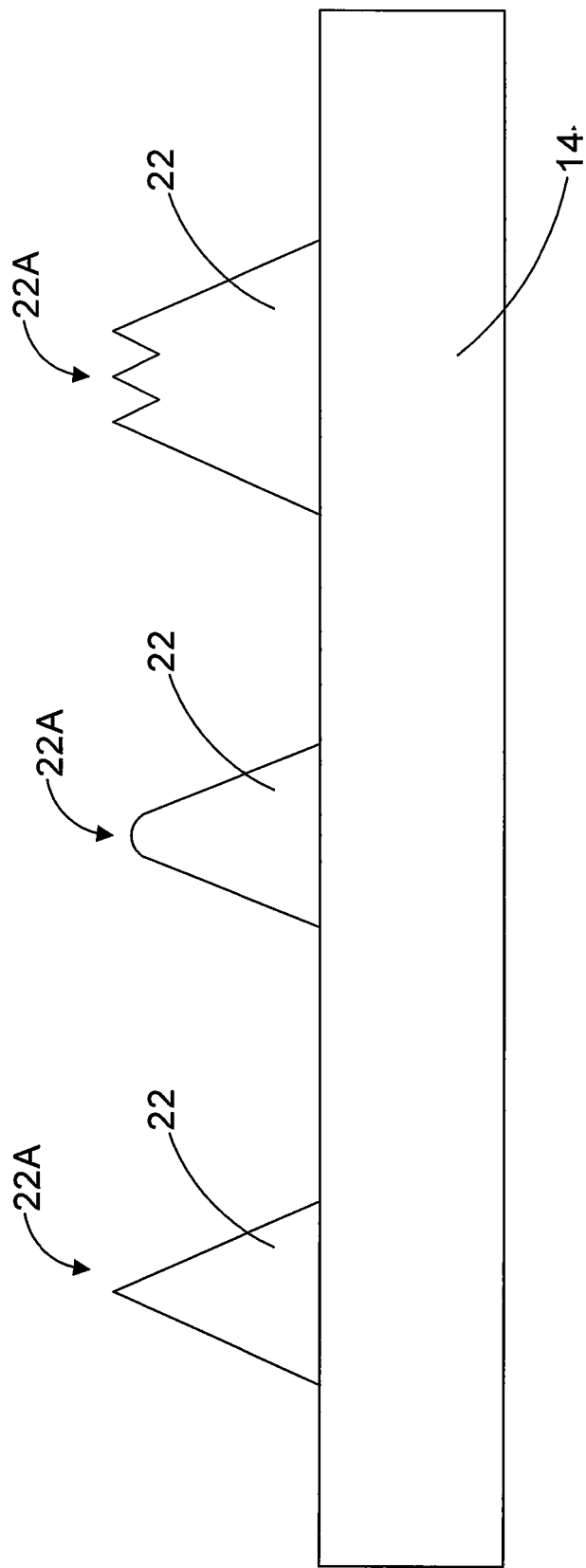
FIG. 4 depicts a variety of illustrative end configurations for the piercing bond structures disclosed herein.

As shown in FIG. 4, the piercing bond structures 22 may have a variety of configurations for the piercing end 22A of the structure 22. For example, the piercing end 22A may be pointed, rounded or comprise multiple peaks as depicted on the piercing bond structures 22 in FIG. 4 (from left to right).

FIGS. 5A-5D depict one illustrative process flow for forming the piercing bond structures 22 described herein. Initially, as shown in FIG. 5A, a masking layer 80 is formed above a layer of conductive material 82. The masking layer 80 may be comprised of a variety of materials, e.g., a photoresist material, and it may be formed using traditional photolithography techniques. The layer of conductive material 80 may be comprised of a variety of different materials, e.g., gold, and it may be formed by a variety of known techniques, e.g., plating.

As shown in FIG. 5B, an anisotropic etching process 84 is performed to partially define conductive structures 86 having sloped sidewalls 87. The etching process 84 may be stopped at a point in time such that a portion 88 of the layer of conductive material 80 is not etched completely away. In some applications, stopping the etch process 84 so as to leave a remaining portion 88 of the layer of conductive material 82 may not be required. As shown in FIG. 5C, the masking layer 80 is removed, and an isotropic etching process 89 is performed until such time as the piercing bond structures 22 depicted in FIG. 5D are formed. Note that, in the illustrative embodiment depicted herein, the piercing bond structures 22 have a substantially triangular cross-sectional configuration and a substantially pointed end 22A. The end 22A of the piercing bond structure 22 is generally non-planar or non-flat, but it may take on other configurations. For example, FIG. 4 depicts various illustrative configurations for the end 22A of the piercing bond structures 22.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    an integrated circuit die having a plurality of solder balls that are conductively coupled to bond pads on the die, each of the solder balls having a layer of oxide on an outer surface thereof; and
    a substrate comprising a plurality of piercing bond structures, each of the piercing bond structures penetrating and extending at least partially into a corresponding solder ball to thereby establish a conductive connection between the solder ball and the piercing bond structure, the piercing bond structure penetrating the layer of oxide.

2. The device of claim 1, wherein the piercing bond structures have a non-flat end.

3. The device of claim 1, wherein each of the piercing bond structures comprises at least one anti-oxidation layer formed on an outer surface of the piercing bond structure.

4. The device of claim 3, wherein the at least one anti-oxidation layer comprises a plurality of layers of material.

5. The device of claim 4, wherein the plurality of layers comprises a layer comprising gold formed on an exposed surface of the piercing bond structure and a layer comprising nickel formed on the layer comprising gold.

6. The device of claim 1, wherein the plurality of piercing bond structures has a substantially triangular cross-sectional configuration.

7. An integrated circuit device, comprising:
    a first component configured to be conductively coupled to a first solder ball and a second solder ball, the first solder ball having a first layer of oxide, the second solder ball having a second layer of oxide, wherein the first solder ball is larger than the second solder ball; and
    a second component configured to have a first piercing bond structure and a second piercing bond structure, wherein the first piercing bond structure penetrates the first layer of oxide and extends at least partially into the first solder ball to establish a first conductive connection, and wherein the second piercing bond structure penetrates the second layer of oxide and extends at least partially into the second solder ball to establish a second conductive connection.

8. The device of claim 7, wherein the first piercing bond structure includes a non-flat end, and wherein at least one anti-oxidation layer is formed on an outer surface of the first piercing bond structure.

9. The device of claim 8, wherein the at least one anti-oxidation layer comprises a plurality of layers of material, and wherein the plurality of layers comprises a layer comprising gold formed on an exposed surface of the first piercing bond structure and a layer comprising nickel formed on the layer comprising gold.

10. The device of claim 7, wherein the second piercing bond structure includes a non-flat end, and wherein at least one anti-oxidation layer is formed on an outer surface of the second piercing bond structure.

11. The device of claim 10, wherein the at least one anti-oxidation layer comprises a plurality of layers of material, and wherein the plurality of layers comprises a layer comprising gold formed on an exposed surface of the second piercing bond structure and a layer comprising nickel formed on the layer comprising gold.

12. The device of claim 7, wherein the first piercing bond structure and the second piercing bond structure respectively have a substantially triangular cross-sectional configuration.

13. The device of claim 7, wherein the first piercing bond structure and the second piercing bond structure respectively have a substantially pointed end.

14. The device of claim 7, wherein the first piercing bond structure and the second piercing bond structure respectively have a substantially rounded end.

15. The device of claim 7, wherein the first piercing bond structure and the second piercing bond structure respectively have an end with multiple peaks.

16. An electronic device including a semiconductor structure, the semiconductor structure comprising:
    an integrated circuit component having a plurality of solder balls that are conductively coupled to the integrated circuit, each of the solder balls having a layer of oxide on an outer surface thereof; and
    a plurality of piercing bond structures conductively coupled to a plurality of bond pads, each of the piercing bond structures penetrating and extending at least partially into a corresponding solder ball to establish a conductive connection between the integrated circuit and the plurality of bond pads.

17. The device of claim 16, wherein the plurality of piercing bond structures are positioned on a substrate.

18. The device of claim 16, wherein each of the plurality of piercing bond structures includes a non-flat end, and wherein at least one anti-oxidation layer is formed on an outer surface of the second piercing bond structure.

19. The device of claim 18, wherein the at least one anti-oxidation layer comprises a plurality of layers of material, and wherein the plurality of layers comprises a layer comprising gold formed on an exposed surface of the piercing bond structure and a layer comprising nickel formed on the layer comprising gold.

20. The device of claim 16, wherein the plurality of piercing bond structures respectively have a substantially triangular cross-sectional configuration.

* * * * *